United States Patent
Haraguchi

(10) Patent No.: US 9,642,278 B2
(45) Date of Patent: May 2, 2017

(54) TERMINAL DEVICE

(71) Applicant: PANASONIC INTELLECTUAL PROPERTY MANAGEMENT CO., LTD., Osaka (JP)

(72) Inventor: Taku Haraguchi, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/641,710

(22) Filed: Mar. 9, 2015

(65) Prior Publication Data
US 2015/0264821 A1 Sep. 17, 2015

(30) Foreign Application Priority Data
Mar. 11, 2014 (JP) ................................ 2014-047998

(51) Int. Cl.
*H05K 7/14* (2006.01)
*H01R 9/24* (2006.01)
*H01R 4/34* (2006.01)

(52) U.S. Cl.
CPC ......... *H05K 7/1469* (2013.01); *H01R 9/2416* (2013.01); *H01R 4/34* (2013.01)

(58) Field of Classification Search
CPC ....... H05K 7/1469; H05K 5/0052; H01R 9/24
USPC ................................ 174/549, 562
See application file for complete search history.

(56) References Cited

U.S. PATENT DOCUMENTS

| 4,564,254 A | * | 1/1986 | van Alst | H01R 4/2433 439/404 |
| 5,203,716 A | * | 4/1993 | Martucci | H01R 4/2466 439/411 |
| 5,756,935 A | * | 5/1998 | Balanovsky | H01R 24/46 174/549 |

(Continued)

FOREIGN PATENT DOCUMENTS

| JP | 62-99173 | 6/1987 |
| JP | 03-252018 | 11/1991 |

(Continued)

OTHER PUBLICATIONS

U.S. Appl. No. 14/638,187 to Taku Haraguchi, filed Mar. 4, 2015.

(Continued)

*Primary Examiner* — Hoa C Nguyen
*Assistant Examiner* — Stanley Tso
(74) *Attorney, Agent, or Firm* — Greenblum & Bernstein, P.L.C.

(57) ABSTRACT

A terminal plate includes a main portion having a screw hole, and a first and second leg portion which protrude from the main portion in the same direction. The first leg portion is formed longer than the second leg portion. The device housing includes an outer wall which has a first attachment hole into which the first leg portion is inserted, a second attachment hole into which the second leg portion is inserted, and a depressed portion into which the terminal screw is inserted. The printed wiring board is electrically connected to the first leg portion, and a center of the screw hole is misaligned with respect to a straight line extending through a center of the first attachment hole and a center of the second attachment hole when the terminal plate is attached to the device housing and seen in a direction perpendicular to the main portion.

5 Claims, 4 Drawing Sheets

(56) References Cited

U.S. PATENT DOCUMENTS

| | | | |
|---|---|---|---|
| 6,783,380 B1* | 8/2004 | Kamath | H01R 13/62905 439/247 |
| 7,078,620 B2* | 7/2006 | Ikeda | B60R 11/02 174/50 |
| 8,882,547 B2 | 11/2014 | Asakuma et al. | |
| 9,036,366 B2 | 5/2015 | Takemori et al. | |
| 2004/0086240 A1* | 5/2004 | Togami | G02B 6/4246 385/92 |
| 2011/0170269 A1* | 7/2011 | Blossfeld | H01R 43/18 361/752 |
| 2012/0320544 A1* | 12/2012 | Ohhashi | H05K 5/0052 361/752 |
| 2013/0023165 A1* | 1/2013 | Sasahara | F16B 43/00 439/805 |
| 2014/0262481 A1* | 9/2014 | Khoury | H02G 3/14 174/480 |
| 2015/0118889 A1* | 4/2015 | Assif | H01R 4/5008 439/372 |

FOREIGN PATENT DOCUMENTS

| | | |
|---|---|---|
| JP | 2000-188793 | 7/2000 |
| JP | 2001-086577 | 3/2001 |
| JP | 2002-150882 | 5/2002 |
| TW | 200850033 | 12/2008 |

OTHER PUBLICATIONS

Office Action from Taiwan Intellectual Property Office (TIPO) in Taiwanese Patent Appl. No. 104107371, dated Jul. 19, 2016, along with an English language translation.

* cited by examiner

TERMINAL DEVICE

CROSS-REFERENCE TO RELATED APPLICATION

This application claims priority to Japanese Patent Application No. 2014-047998 filed on Mar. 11, 2014, the entire contents of which are incorporated herein by reference.

TECHNICAL FIELD

The present disclosure relates to a terminal device.

BACKGROUND ART

Conventionally, there is provided a remote monitoring control system in which a transmission processing device, an operation terminal device and a control terminal device are connected by two signal lines (see, e.g., Japanese Unexamined Patent Application Publication No. 2001-86577). In the remote monitoring control system, specific addresses are respectively allotted to the operation terminal device and the control terminal device.

The operation terminal device includes a plurality of switches. As the states of the switches are changed, e.g., by pressing the switches, the operation terminal device transmits the information as operation data to the transmission processing device.

The transmission processing device gains access to each of the operation terminal device and the control terminal device and receives operation data from the operation terminal device. Furthermore, the transmission processing device transmits control data to the control terminal device which is previously associated, by an address, with the operation terminal device that has generated the operation data.

The control terminal device includes relays provided therein. Upon receiving the control data from the transmission processing device, the control terminal device turns on or off the relays, thereby controlling loads.

Each of the operation terminal device and the control terminal device (hereinafter abbreviated as "terminal device") includes, e.g., a transceiver circuit unit for transmitting and receiving a transmission signal or the like, a terminal processing unit for, e.g., monitoring the operation states of the switches and executing control of the relays, and a synthetic-resin-made device housing, and so forth. The terminal processing unit and the transceiver circuit unit are realized by, e.g., mounting an integrated circuit on a printed wiring board.

The device housing is composed of a synthetic resin molded body having a rectangular box-like shape and is configured to accommodate the printed wiring board therein. The device housing includes a pair of terminal attachment parts provided in the rear side wall (or the rear wall) thereof. Each of the terminal attachment parts includes two attachment holes into which signal line terminals are inserted, and a cylindrical depressed portion provided between the two attachment holes and provided with a bottom. The terminals are so-called screw terminals. Each of the terminals includes a terminal plate and a terminal screw.

The terminal plate includes a rectangular main portion and a pair of leg portions. One of the leg portions (a first leg portion) is electrically connected to a circuit of the printed wiring board through, e.g., a lead wire. The other leg portion (a second leg portion) is used to fix the terminal to the device housing and is formed short so as not to interfere with the printed wiring board. In this case, it is desirable that the lead wire is formed to have a necessary minimum length required in interconnecting a specified portion of the printed wiring board and the first leg portion. If the second leg portion is inserted into the attachment hole corresponding to the first leg portion (a first attachment hole) and if the first leg portion is inserted into the attachment hole corresponding to the second leg portion (a second attachment hole), there is a possibility that the length of the lead wire is insufficient. If the length of the lead wire is prolonged, time and effort are taken in dealing with the extra length of the lead wire.

That is to say, it is desirable that the first leg portion is inserted into the first attachment hole while the second leg portion is inserted into the second attachment hole.

In the conventional example, the main portion of the terminal plate is formed to have a line symmetry shape with respect to a straight line which passes through the midpoints of the sides connected to the leg portions. Thus, the terminal plate can be attached to the device housing even in a 180 degree rotated state. In the conventional example, there is a possibility that, during assembly, the terminal plate is reversely attached to the device housing by a worker. If the terminal plate is reversely attached, it becomes difficult to electrically interconnect the terminal plate and the printed wiring board.

SUMMARY OF THE INVENTION

In view of the above, the present invention provides a terminal device capable of enhancing the ease of assembly.

In accordance with an aspect of the present invention, there is provided a terminal device, including: a terminal to which a signal line is to be connected; a printed wiring board to be electrically connected to the terminal; and a device housing configured to accommodate the printed wiring board therein, wherein the terminal includes a terminal plate and a terminal screw, the terminal plate includes a main portion having a screw hole, and a first leg portion and a second leg portion which protrude from the main portion in the same direction, the first leg portion is formed longer than the second leg portion, the device housing includes an outer wall which has a first attachment hole into which the first leg portion is configured to be inserted, a second attachment hole into which the second leg portion is configured to be inserted, and a depressed portion into which the terminal screw is configured to be inserted through the screw hole, the printed wiring board is to be electrically connected to the first leg portion inserted into the first attachment hole, and a center of the screw hole of the terminal plate is misaligned with respect to a straight line extending through a center of the first attachment hole and a center of the second attachment hole when the terminal plate is attached to the device housing and seen in a direction perpendicular to the main portion.

The terminal device of the present disclosure is configured such that the terminal plate is not in rotation symmetry with respect to a rotation axis passing through the center of the screw hole. Thus, there is no possibility that the terminal plate is erroneously attached to the device housing in a 180 degree rotated state. Accordingly, there is provided an effect of enhancing the ease of assembly.

BRIEF DESCRIPTION OF THE DRAWINGS

The figures depict one or more implementations in accordance with the present teaching, by way of example only, not by way of limitations. In the figures, like reference numerals refer to the same or similar elements.

DETAILED DESCRIPTION

An embodiment in which the technical concept of the present invention is applied to an operation terminal device of a remote monitoring control system disclosed in Japanese Unexamined Patent Application Publication No. 2001-86577 will now be described in detail. However, a terminal device to which the technical concept of the present invention can be applied is not limited to the operation terminal device of the present embodiment.

Figure 7:
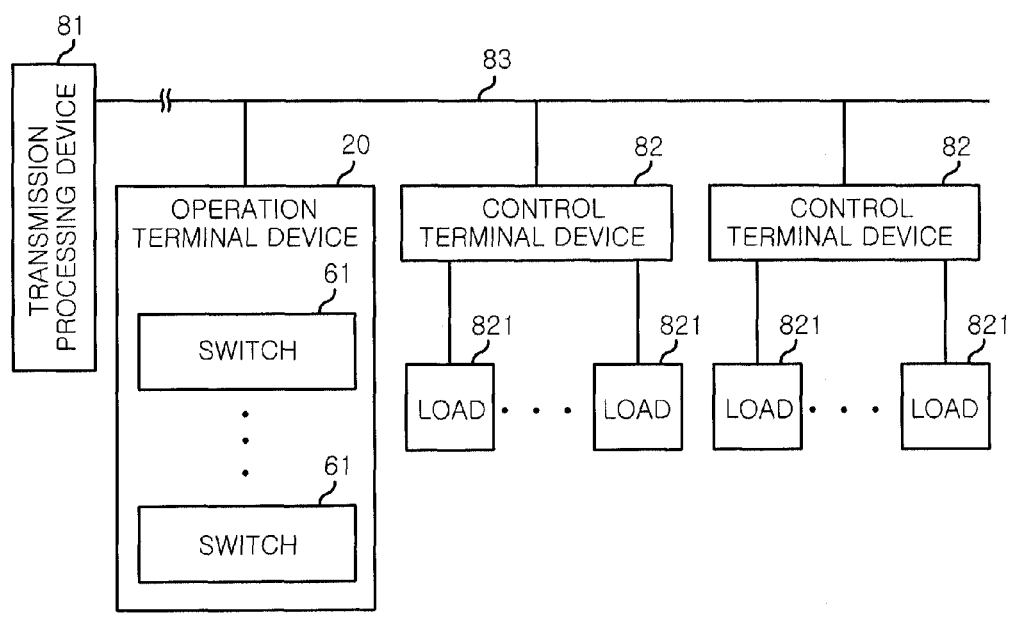
FIG. 7 is a schematic configuration view of a remote monitoring control system which employs the terminal device according to the embodiment of the present invention.

First, a remote monitoring control system which employs the operation terminal device according to the present embodiment will be briefly described with reference to FIG. 7.

The remote monitoring control system includes a transmission processing device 81, an operation terminal device 20, and control terminal devices 82. The operation terminal device 20 for monitoring the operation states of switches 61 and the control terminal devices 82 for controlling loads 821 are connected to the transmission processing device 81 through two-wire-type signal lines 83. The operation terminal device 20 and the control terminal devices 82 are allotted with specific addresses. Using these addresses, the transmission processing device 81 individually recognizes the operation terminal device 20 and the control terminal devices 82.

The transmission processing device 81 executes transmission and reception of data between the operation terminal device 20 and the control terminal devices 82 using time division multiplex transmission signals. The operation terminal device 20 includes switches 61 composed of a plurality of tact switches as described later. If one of the switches 61 is operated, the operation terminal device 20 transmits operation data to the transmission processing device 81 using the transmission signals.

Upon receiving the operation data from the operation terminal device 20, the transmission processing device 81 searches and acquires the address of the operation terminal device 20.

The transmission processing device 81 stores the correspondence relationship of the address of the operation terminal device 20 and the numbers of the switches 61 with the addresses of the control terminal devices 82 and the numbers of loads 821. Upon acquiring the address of the operation terminal device 20, the transmission processing device 81 transmits control data to the control terminal device 82 to which the load 821 corresponding to the number of the operated switch 61 is connected. Upon receiving the control data, the control terminal device 82 controls the load 821 having the number designated by the control data.

Figure 2:
FIG. 2 is a block diagram showing an internal circuit of the terminal device according to the embodiment of the present invention.

Next, the circuit configuration of the operation terminal device 20 will be described with reference to FIG. 2.

The operation terminal device 20 includes a terminal processing unit 91, a transceiver circuit unit 92, a switch input circuit unit 93, and so forth. The transceiver circuit unit 92 is connected to the signal lines 83 through terminals 70 and is configured to transmit and receive the operation data and the control data. The switch input circuit unit 93 includes the switches 61 and transmits the operation state of the operated switch 61 to the terminal processing unit 91 when one of the switches 61 is operated. The terminal processing unit 91 includes a dedicated integrated circuit having a microprocessor therein. Upon receiving the operation state of the operated switch 61 from the switch input circuit unit 93, the terminal processing unit 91 transmits a transmission signal from the transceiver circuit unit 92 to the transmission processing device 81 through the signal lines 83, thereby notifying the operation state of the operated switch 61 to the transmission processing device 81.

Next, the structure of the operation terminal device 20 will be described with reference to FIG. 1. In the following description, an up-down direction, a left-right direction and a front-rear direction will be defined on the basis of FIG. 1.

The operation terminal device 20 includes a device housing 40, a printed wiring board 60, terminals 70, a decoration cover 50, and so forth. The device housing 40 includes a body 401 and a lid 402.

The body 401 is made of a synthetic resin and is formed into a substantially box-like shape with a front surface thereof opened. Two terminal attachment parts, each of which includes a first attachment hole 481, a second attachment hole 482 and a depressed portion 47, are provided in the bottom wall of the body 401. That is to say, two terminals 70 to which the signal lines 83 are connected are attached to the rear surface of the bottom wall of the body 401 (see FIG. 6). The first attachment hole 481 and the second attachment hole 482 are formed into a vertically-elongated rectangular shape. The depressed portion 47 having a cylindrical shape is provided between the first attachment hole 481 and the second attachment hole 482. The depressed portion 47 protrudes forward from the bottom wall of the body 401. The depressed portion 47 is formed into a closed-bottom cylindrical shape so as to protrude forward from the bottom wall of the body 401 (see FIG. 5).

Six ribs 43 are provided on the front surface of the bottom wall of the body 401. Each of five ribs 43 except the rib 43 positioned at or around the center of the body 401 includes a stepped portion 431 formed at the tip thereof. The printed wiring board 60 is fitted to the stepped portions 431 of the ribs 43 and is therefore position-decided in the left-right direction. Furthermore, the printed wiring board 60 is position-decided in the up-down direction by virtue of stopper plates 432 provided in the body 401. Moreover, the printed wiring board 60 is fixed by a screw threaded into a screw hole 433 formed in the rib 43 positioned at or around the center of the body 401.

Figure 5:
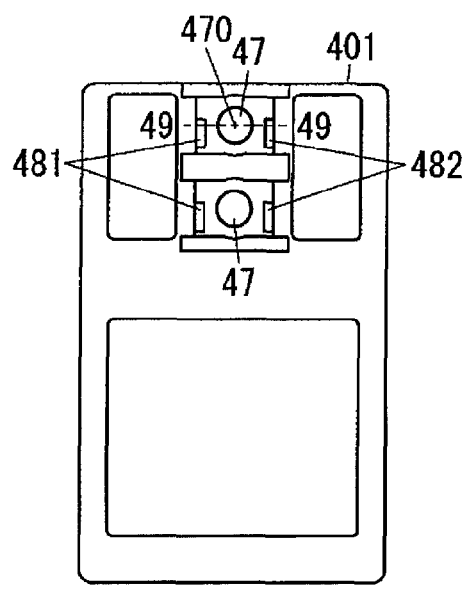
FIG. 5 is a rear view showing a device housing of the terminal device according to the embodiment of the present invention.
Figure 6:
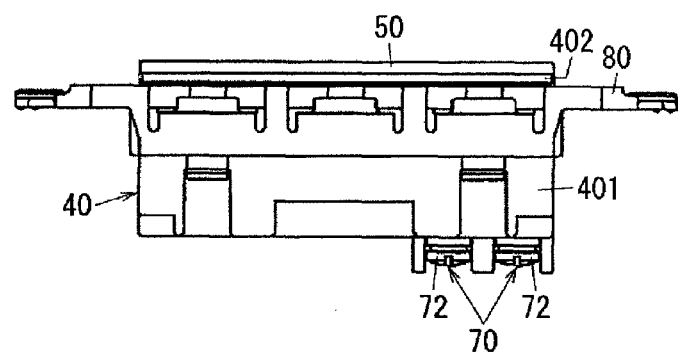
FIG. 6 is a side view showing the device housing of the terminal device according to the embodiment of the present invention.

As shown in FIG. 5, each of the terminal attachment parts is formed such that the center 470 of the depressed portion 47, the center of the first attachment hole 481 and the center of the second attachment hole 482 are not arranged side by side on an imaginary straight line 49 extending through the center 470 of the depressed portion 47. In other words, each of the terminal attachment parts is formed so as not to be in rotation symmetry about the center 470 of the depressed portion 47.

Figure 1:
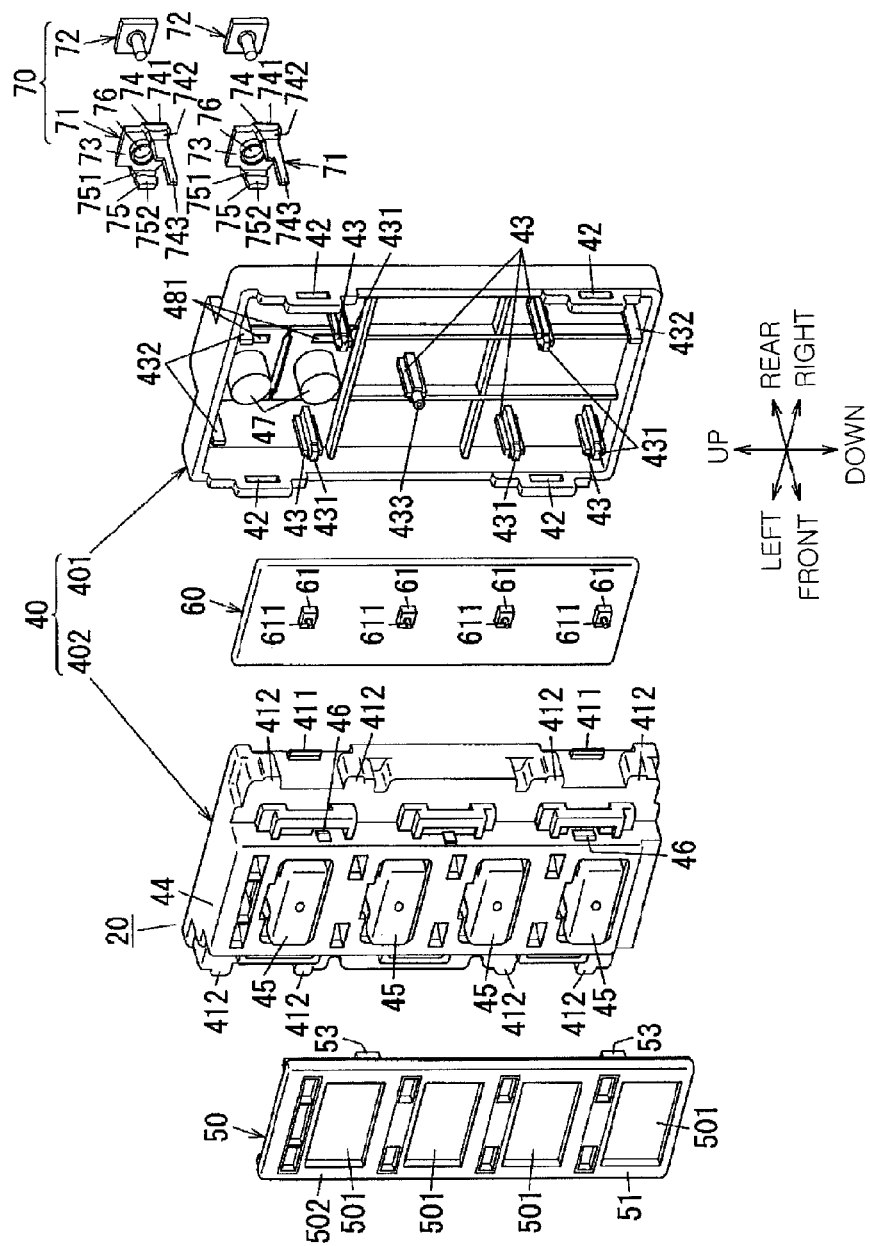
FIG. 1 is an exploded perspective view showing a terminal device according to an embodiment of the present invention.

As shown in FIG. 1, the lid 402 is made of a synthetic resin and is formed into a substantially box-like shape with the rear surface thereof opened. A protrusion portion 44 is provided on the front surface of the bottom wall of the lid 402 so as to protrude forward. Handles 45 having a substantially rectangular shape are integrally formed with the front wall of the protrusion portion 44. The handles 45 are disposed to correspond to the push buttons 611 of the switches 61 when the device housing 40 is assembled. Thus, if the handles 45 are pushed, the push buttons 611 of the switches 61 are pressed and operated.

The lid 402 includes assembling claws 411 provided at four points in the opposite edges of the lid 402. The body 401 includes four assembling holes 42 formed on the left and right side surfaces of the body 401 in a corresponding relationship with the assembling claws 411. As the assembling claws 411 and the assembling holes 42 are fitted and coupled to each other, the body 401 and the lid 402 make up the device housing 40.

The lid 402 includes two pairs of locking claws 412 provided on each of the left and right side surfaces thereof. The device housing 40 is detachably attached to an attachment frame 80 by the locking claws 412 (see FIG. 6). The attachment frame 80 is well-known in the related art and is configured such that an embedment-type wiring instrument is embedded and disposed in the attachment frame 80.

The printed wiring board 60 is formed into a rectangular shape. Four switches 61 are mounted on the front surface of the printed wiring board 60. The terminal processing unit 91, the transceiver circuit unit 92 and the like are mounted on the rear surface of the printed wiring board 60.

The decoration cover 50 is made of a synthetic resin and is formed into a substantially rectangular plate shape. Four openings 501, into which four handles 45 are respectively inserted, are formed in the decoration cover 50 and are arranged side by side in the up-down direction. The decoration cover 50 includes engaging pieces 53 perpendicularly protruding from four points of the rear surface of the decoration cover 50. The engaging pieces 53 engage with a projection portions 46 provided on the side surfaces of the protrusion portion 44 of the lid 402. Thus, the decoration cover 50 is detachably attached to the front surface of the protrusion portion 44 protruding forward from the bottom wall of the lid 402.

A nameplate 51 made of a transparent material, e.g., a membrane sheet, is bonded to the front surface 502 of the decoration cover 50. Name cards (not shown) are attached to the front surfaces of the handles 45 integrally formed with the protrusion portion 44 of the lid 402 and are interposed between the nameplate 51 and the handles 45.

Figure 3:
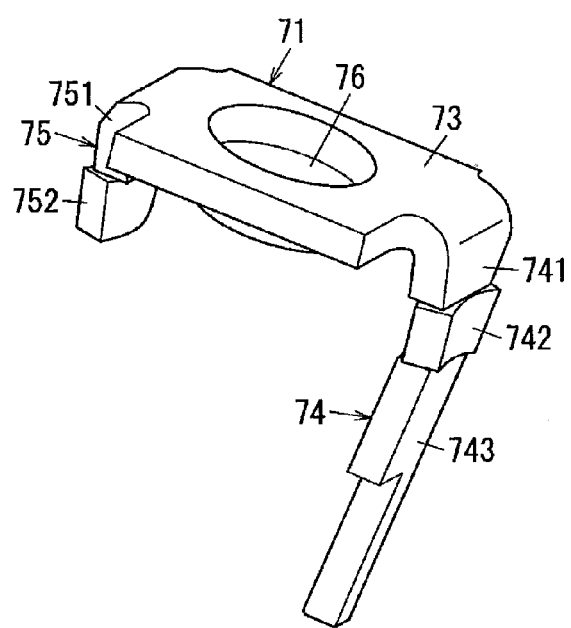
FIG. 3 is a perspective view showing a terminal plate of the terminal device according to the embodiment of the present invention.
Figure 4:
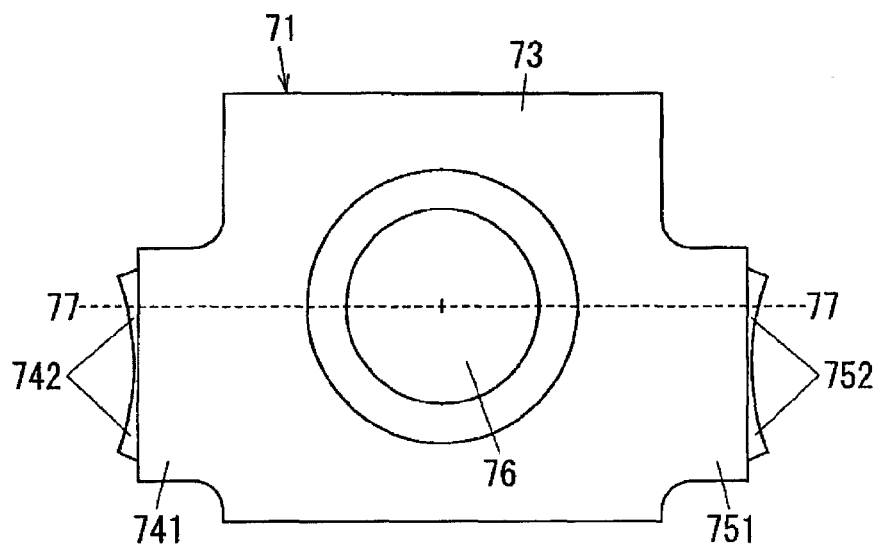
FIG. 4 is a front view showing the terminal plate of the terminal device according to the embodiment of the present invention.

Finally, the attachment structure of the terminals 70 which is a feature of the present invention will be described with reference to FIGS. 1, 3 and 4.

Each of the terminals 70 includes a terminal plate 71 and a terminal screw 72. The terminal plate 71 is made of a metallic material. The terminal plate 71 includes a main portion 73, a first leg portion 74 and a second leg portion 75, which are integrally formed with one another. As shown in FIGS. 3 and 4, the main portion 73 is formed into a substantially rectangular shape and is provided with a screw hole 76 at the center thereof. The first leg portion 74 and the second leg portion 75 extend from the left and right sides of the main portion 73 in a perpendicular relationship with a surface of the main portion 73 attached to the body 401.

The first leg portion 74 includes a first interconnecting piece 741, a first removal-preventing piece 742 and a connection piece 743. The first interconnecting piece 741 extends from one side of the main portion 73 and is bent at a substantially right angle with respect to the main portion 73. The first removal-preventing piece 742 is disposed between the first interconnecting piece 741 and the connection piece 743. Two notches are formed in borders of the first removal-preventing piece 742 with the first interconnecting piece 741 and the connection piece 743. Due to the formation of the notches, the first removal-preventing piece 742 is formed into an arc shape so as to protrude outward. The connection piece 743 is formed into a rectangular parallelepiped shape with a portion thereof cut away.

The second leg portion 75 includes a second interconnecting piece 751 and a second removal-preventing piece 752. The second interconnecting piece 751 extends from the opposite side of the main portion 73 from the side where the first interconnecting piece 741 is provided. The second interconnecting piece 751 is bent at a substantially right angle with respect to the main portion 73 so as to extend in the same direction as the first leg portion 74. A notch is formed in a border of the second removal-preventing piece 752 with the second interconnecting piece 751. Due to the formation of the notch, the second removal-preventing piece 752 is formed into an arc shape so as to protrude outward. The second leg portion 75 is not provided with any connection piece and is formed to have a length shorter than the length of the first leg portion 74.

The first leg portion 74 is inserted into the first attachment hole 481 to a position where the first removal-preventing piece 742 reaches the front surface side of the bottom wall of the body 401. On the other hand, the second leg portion 75 is inserted into the second attachment hole 482 to a position where the second removal-preventing piece 752 reaches the front surface side of the bottom wall of the body 401. Thus, the outwardly-protruding portions of the first removal-preventing piece 742 and the second removal-preventing piece 752 are caught on the front surface of the bottom wall of the body 401, whereby the first leg portion 74 and the second leg portion 75 are prevented from being removed from the body 401 (see FIG. 4).

The terminal screw 72 is threadedly coupled to the screw hole 76 of the terminal plate 71. The threaded portion (or the body portion) of the terminal screw 72 is inserted into the depressed portion 47 of the body 401 (see FIG. 5).

The first leg portion 74 is connected to a conductor (e.g., a copper foil) of the printed wiring board 60 through a lead wire. In this case, it is preferred that the lead wire is formed to have a necessary minimum length required in interconnecting a specified portion of the printed wiring board 60 and the connection piece 743. If the terminal plate 71 is fitted to the device housing 40 in a 180 degree rotated state, the length of the lead wire becomes insufficient. This makes it difficult to electrically interconnect the first leg portion 74 and the printed wiring board 60. If the length of the lead wire is prolonged, time and effort are taken in dealing with the extra length of the lead wire.

That is to say, it is preferred that the first leg portion 74 is inserted into the first attachment hole 481 while the second leg portion 75 is inserted into the second attachment hole 482.

In the terminal of the conventional example (the operation terminal device) disclosed in Japanese Unexamined Patent Application Publication No. 2001-86577, the terminal plate is in rotation symmetry with respect to a rotation axis passing through the center of the terminal screw. For that reason, there may be a case where the terminal plate is attached to the device housing even in a 180 degree rotated state. On the other hand, in the terminal 70 of the present embodiment, as shown in FIG. 4, the terminal plate 71 is formed such that, when seen from the front side, the center of the screw hole 76, the center of the first interconnecting piece 741 and the center of the second interconnecting piece 751 are not arranged side by side on an imaginary straight line 77 extending through the center of the screw hole 76. In other words, the terminal plate 71 is configured so as not to be in rotation symmetry about the center of the terminal screw 72.

The terminal screw 72 is threadedly coupled to a location where the screw hole 76 and the depressed portion 47 of the body 401 overlap with each other. In this case, the first leg portion 74 is inserted into only the first attachment hole 481 while the second leg portion 75 is inserted into only the second attachment hole 482. When the terminal plate 71 is in a 180 degree rotated state, it is impossible to attach the terminal 70 to the body 401.

Furthermore, the first leg portion 74 may be inserted into a through-hole formed in a specified position of the printed wiring board 60 and may be connected to the printed wiring board 60 by soldering. Even in this case, it can be said that there is a need to avoid the problem of reverse insertion.

The terminal device (the operation terminal device 20) of the present embodiment includes the terminals 70 to which the signal lines 83 are connected, the printed wiring board electrically connected to the terminals 70, and the device housing 40 configured to accommodate the printed wiring board 60. Each of the terminals 70 includes the terminal plate 71 and the terminal screw 72. The terminal plate 71 includes the main portion 73 having the screw hole 76, and the first leg portion 74 and the second leg portion which protrude from the main portion 73 in the same direction. The first leg portion 74 is formed longer than the second leg portion 75. The device housing 40 includes the outer wall (or the bottom wall) which has the first attachment hole 481 into which the first leg portion 74 is inserted, the second attachment hole 482 into which the second leg portion 75 is inserted, and the depressed portion 47 into which the terminal screw 72 is inserted. The printed wiring board 60 is electrically connected to the first leg portion 74 inserted into the first attachment hole 481. The terminal plate 71 is configured so as not to be in rotation symmetry with respect to a rotation axis passing through the center of the screw hole 76. In other words, a center of the screw hole of the terminal plate is misaligned with respect to a straight line extending through a center of the first attachment hole and a center of the second attachment hole when the terminal plate is attached to the device housing and seen in a direction perpendicular to the main portion.

Accordingly, in the terminal device of the present embodiment, the terminals 70 cannot be attached to the device housing 40 in a 180 degree rotated state. As a result, it is possible to enhance the ease of assembly.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A terminal device, comprising:
a terminal to which a signal line is to be connected;
a printed wiring board electrically connected to the terminal; and
a device housing configured to accommodate the printed wiring board therein,
wherein the terminal includes a terminal plate made of a metallic material and a terminal screw,
the terminal plate is attached to the device housing and includes a substantially flat plate-shaped main portion having a screw hole, the terminal plate further including a first leg and a second leg respectively and directly protruding from two opposite sides of the main portion in a same direction normal to an attachment surface, the attachment surface being a surface of the main portion attached to the device housing,
the first leg and the second leg directly extend from different ones of a left side and a right side of the substantially flat plate-shaped main portion,
the first leg and the second leg each directly extend from the main portion in a perpendicular relationship with the attachment surface of the main portion,
the first leg is longer than the second leg,
the device housing includes an outer wall which has a first attachment hole into which the first leg is inserted, a second attachment hole into which the second leg is inserted, and a depressed portion into which the terminal screw is inserted through the screw hole,
the printed wiring board is electrically connected to the first leg inserted into the first attachment hole,
the first leg includes a first interconnecting piece extending from the main portion, a connection piece, and a first removal-preventing piece disposed between the first interconnecting piece and the connection piece, the first leg being electrically connected to the printed wiring board through the connection piece,
the second leg includes a second interconnecting piece extending from the main portion and a second removal-preventing piece connected to the second interconnecting piece,
the second leg does not include the connection piece,
the first removal-preventing piece and the second removal-preventing piece each have an arc shape that protrudes outward from the main portion of the terminal plate,
outer portions of the arc shape of the first removal-preventing piece extend outward of peripheries of the first interconnecting piece and the connection piece,
outer portions of the arc shape of the second removal-preventing piece extend outward of a periphery of the second interconnecting piece,
the first removal-preventing piece and the second removal-preventing piece contact an inner surface of the outer wall of the device housing to prevent the first and the second leg from being removed from the outer wall,
a center of the screw hole of the terminal plate is misaligned with respect to a straight line extending through a center of the first leg and a center of the second leg when viewed in the same direction, and
the terminal plate does not have rotation symmetry about the center of the screw hole when viewed in the same direction.

2. The terminal device of claim 1, wherein, when viewed in the same direction normal to the main portion, the center of the screw hole is not aligned on a line extending through a center of the first interconnecting piece and a center of the second interconnecting piece.

3. The terminal device of claim 1, wherein the main portion has a substantially rectangular shape.

4. A terminal device, comprising:
a terminal to which a signal line is to be connected;
a printed wiring board electrically connected to the terminal; and
a device housing configured to accommodate the printed wiring board therein,
wherein the terminal includes a terminal plate made of a metallic material and a terminal screw,
the terminal plate includes a substantially rectangular-shaped main portion having a screw hole, the terminal plate further including a first leg and a second leg respectively and directly protruding from two opposite sides of the main portion in a same direction normal to the main portion,
the first leg and the second leg directly extend from different ones of a left side and a right side of the substantially rectangular shape of the main portion,
the first leg and the second leg each directly extend from the main portion in a perpendicular relationship with an attachment surface of the main portion,
the first leg is longer than the second leg,
the device housing includes an outer wall which has a first attachment hole into which the first leg is inserted, a second attachment hole into which the second leg is inserted, and a depressed portion into which the terminal screw is inserted through the screw hole,
the printed wiring board is electrically connected to the first leg inserted into the first attachment hole,
the first leg includes a first interconnecting piece extending from the main portion, a connection piece, and a first removal-preventing piece disposed between the first interconnecting piece and the connection piece, the first leg being electrically connected to the printed wiring board through the connection piece,
the second leg includes a second interconnecting piece extending from the main portion and a second removal-preventing piece connected to the second interconnecting piece,
the second leg does not include the connection piece,
the first removal-preventing piece and the second removal-preventing piece each have an arc shape that protrudes outward from the main portion of the terminal plate,
outer portions of the arc shape of the first removal-preventing piece extend outward of peripheries of the first interconnecting piece and the connection piece,
outer portions of the arc shape of the second removal-preventing piece extend outward of a periphery of the second interconnecting piece,
the first removal-preventing piece and the second removal-preventing piece contact an inner surface of the outer wall of the device housing to prevent the first and the second leg from being removed from the outer wall,
a center of the screw hole of the terminal plate is misaligned with respect to a straight line extending through a center of the first leg and a center of the second leg when viewed in the same direction, and
the terminal plate does not have rotation symmetry about the center of the screw hole when viewed in the same direction.

5. The terminal device of claim 4, wherein, when viewed in the same direction normal to the main portion, the center of the screw hole is not aligned on a line extending through a center of the first interconnecting piece and a center of the second interconnecting piece.

* * * * *